(12) United States Patent
Wang

(10) Patent No.: US 9,072,170 B2
(45) Date of Patent: Jun. 30, 2015

(54) ADJUSTABLE BATTERY BOX AND ELECTRONIC DEVICE USING THE SAME

(71) Applicant: KYE SYSTEMS CORP., New Taipei (TW)

(72) Inventor: Wei-Chuan Wang, New Taipei (TW)

(73) Assignee: KYE SYSTEMS CORP., New Taipei (TW)

( * ) Notice: Subject to any disclaimer, the term of this patent is extended or adjusted under 35 U.S.C. 154(b) by 183 days.

(21) Appl. No.: 13/787,967

(22) Filed: Mar. 7, 2013

(65) Prior Publication Data

US 2014/0168915 A1    Jun. 19, 2014

(30) Foreign Application Priority Data

Dec. 13, 2012   (TW) .............................. 101147119 A

(51) Int. Cl.
*H01M 2/02*   (2006.01)
*H05K 5/00*   (2006.01)
*H01M 2/10*   (2006.01)
*G06F 3/00*   (2006.01)
*H01M 2/00*   (2006.01)

(52) U.S. Cl.
CPC ........... *H05K 5/0047* (2013.01); *H01M 2/1027* (2013.01); *H01M 2/1055* (2013.01); *G06F 3/00* (2013.01); *H01M 2/00* (2013.01)

(58) Field of Classification Search
CPC ..... H01M 2/1027; H01M 2/02; H05K 5/0047
USPC ................... 361/727, 752, 769; 429/164, 163
See application file for complete search history.

(56) References Cited

U.S. PATENT DOCUMENTS

| | | | | |
|---|---|---|---|---|
| 5,543,702 | A | * | 8/1996 | Pfeiffer ......................... 320/110 |
| 6,411,281 | B1 | * | 6/2002 | Sasselli et al. ................. 345/163 |
| 2008/0304258 | A1 | * | 12/2008 | McMillan et al. ............. 362/202 |

* cited by examiner

*Primary Examiner* — Dion R Ferguson
*Assistant Examiner* — Mandeep Buttar
(74) *Attorney, Agent, or Firm* — Bacon & Thomas, PLLC

(57) ABSTRACT

The present invention is related to an adjustable battery box and an electronic device using the same. The battery box has a seat and a battery holder moving relative to the seat along an inclined direction. One electrode spring is mounted on an end of the seat to press against one end of the battery holder. When a battery is inserted in the seat, the battery holder is pushed up by the battery and then the battery holder moves along the inclined direction to compress the electrode spring, so a retaining space of the battery box is enlarged. After the battery is completely retained inside the seat, the electrode spring restores to press against the battery holder to mount the battery. Therefore the battery box is fit for batteries of different sizes.

9 Claims, 7 Drawing Sheets

ADJUSTABLE BATTERY BOX AND ELECTRONIC DEVICE USING THE SAME

CROSS-REFERENCE TO RELATED APPLICATIONS

This application claims the benefit of Taiwan patent application No. 101147119, filed on Dec. 13, 2012, the disclosure of which is incorporated herein in its entirety by reference.

BACKGROUND OF THE INVENTION

1. Field of the Invention

The present invention relates to a battery box, and more particularly to an adjustable battery box.

2. Description of Related Art

Various electronic devices use batteries as a power source. From the perspective of a consumer, although it is convenient to purchase batteries, some inconvenience still occurs. For example, batteries of different types cannot be interchangeably used in one electronic device.

In brief, a double-A battery and a triple-A battery are frequently used in the electronic devices nowadays. However, the size of the battery box is fixed according to the size of the battery. Although the double-A battery and the triple-A battery may be both compatible for one electronic device, the fixed-sized battery box of the electronic device is not fit for both. As a result, a user may buy a battery of the wrong size or may have to store batteries of different sizes, causing trouble in use.

SUMMARY OF THE INVENTION

Due to the disadvantages of usage of the fixed-sized battery box for different types of batteries, an objective of the invention is to provide an adjustable battery box that can adjust a battery retaining space for mounting batteries of different sizes.

The adjustable battery box comprises:

a seat having a first opening and a second opening opposite to the first opening;

a battery holder movable toward the first opening along an inclined direction to be slideably mounted in the second opening of the seat; and a spring having an end pressing against an end of the battery holder along a length direction of the battery holder.

An electronic device using the battery box has a shell, such that the seat of the battery box is integrally formed in the shell. The first opening of the seat is formed through the shell of the electronic device. Hence, the electronic device can use the battery box as mentioned above.

A battery can be inserted in the seat from the first opening of the adjustable battery box. Meanwhile, the battery holder is pushed to move toward the second opening along the inclined direction. At the same time, the spring is compressed to enlarge a depth space and a length space of the battery box. When the battery is completely retained in the battery box, the spring provides a restoring force as a pushing force to push the battery holder along a length direction of the battery holder. The battery holder then presses against the battery in the first opening along the inclined direction to retain the battery in the battery box. Therefore, the battery box of the invention provides proper mounting spaces according to the size of the battery. For example, the electronic device that is compatible with a double-A battery and a triple-A battery can interchangeably use the double-A battery and the triple-A battery to solve the problems as mentioned above.

DETAILED DESCRIPTION OF THE PREFERRED EMBODIMENT

Figure 1:
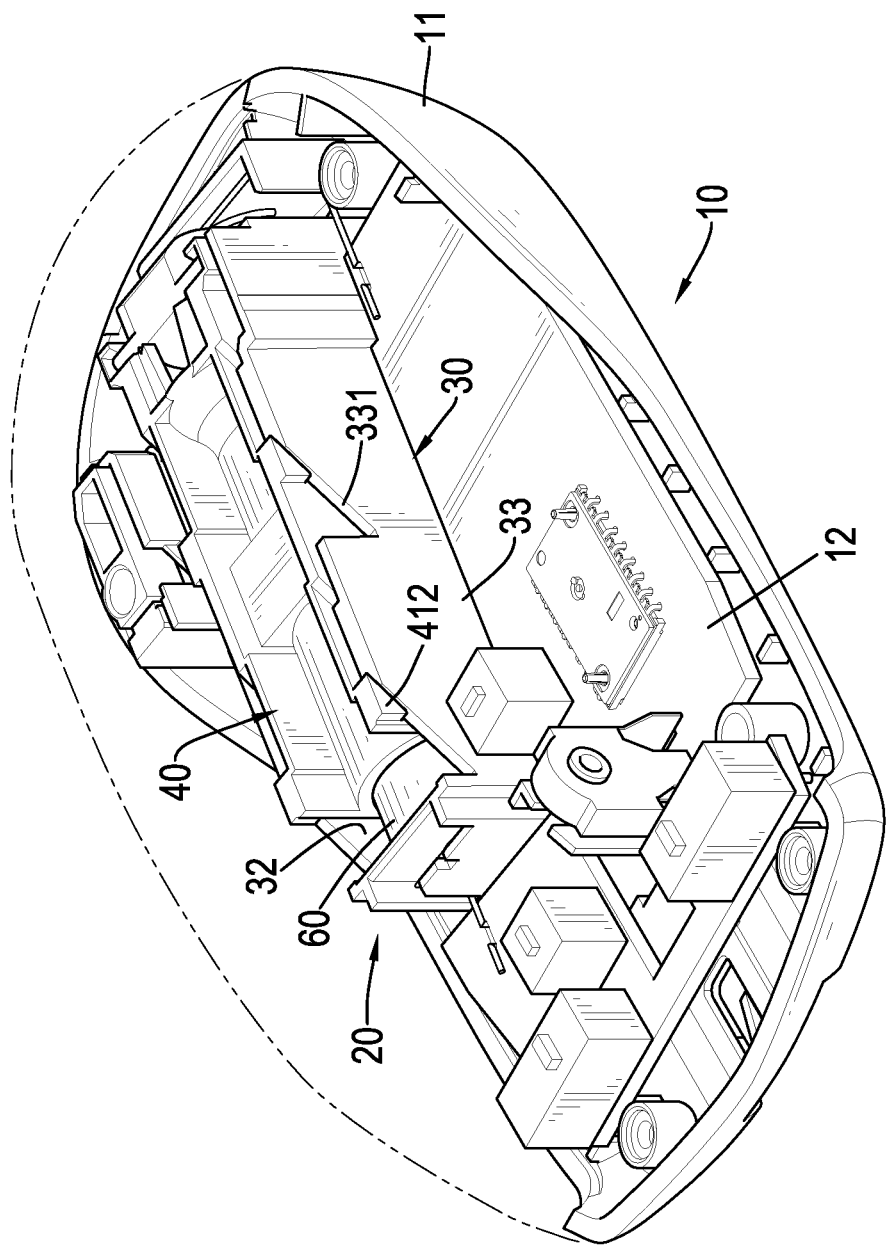
FIG. 1 is a perspective view of an electronic device of the invention.
Figure 2:
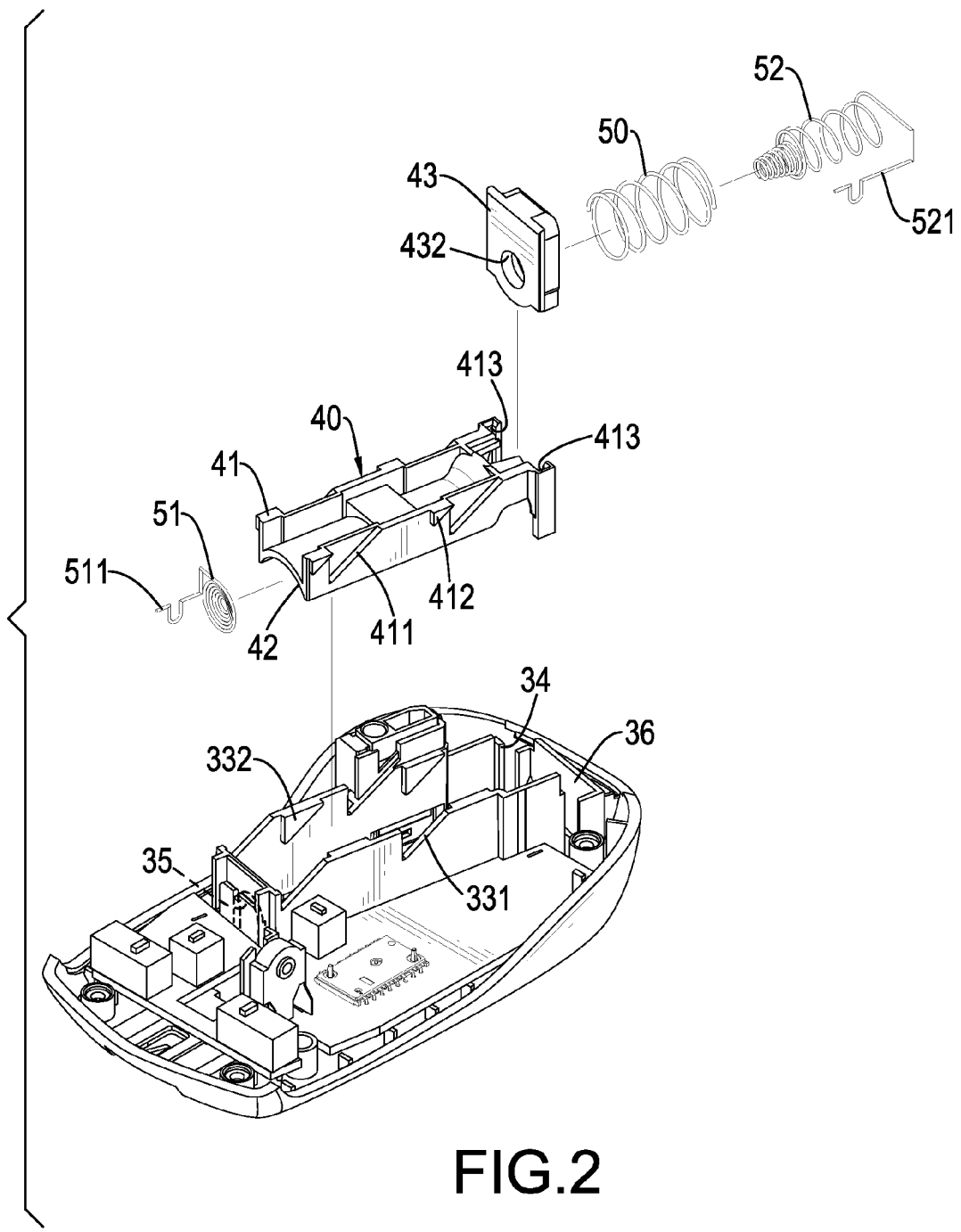
FIG. 2 is an exploded perspective view of the electronic device of FIG. 1.
Figure 3:
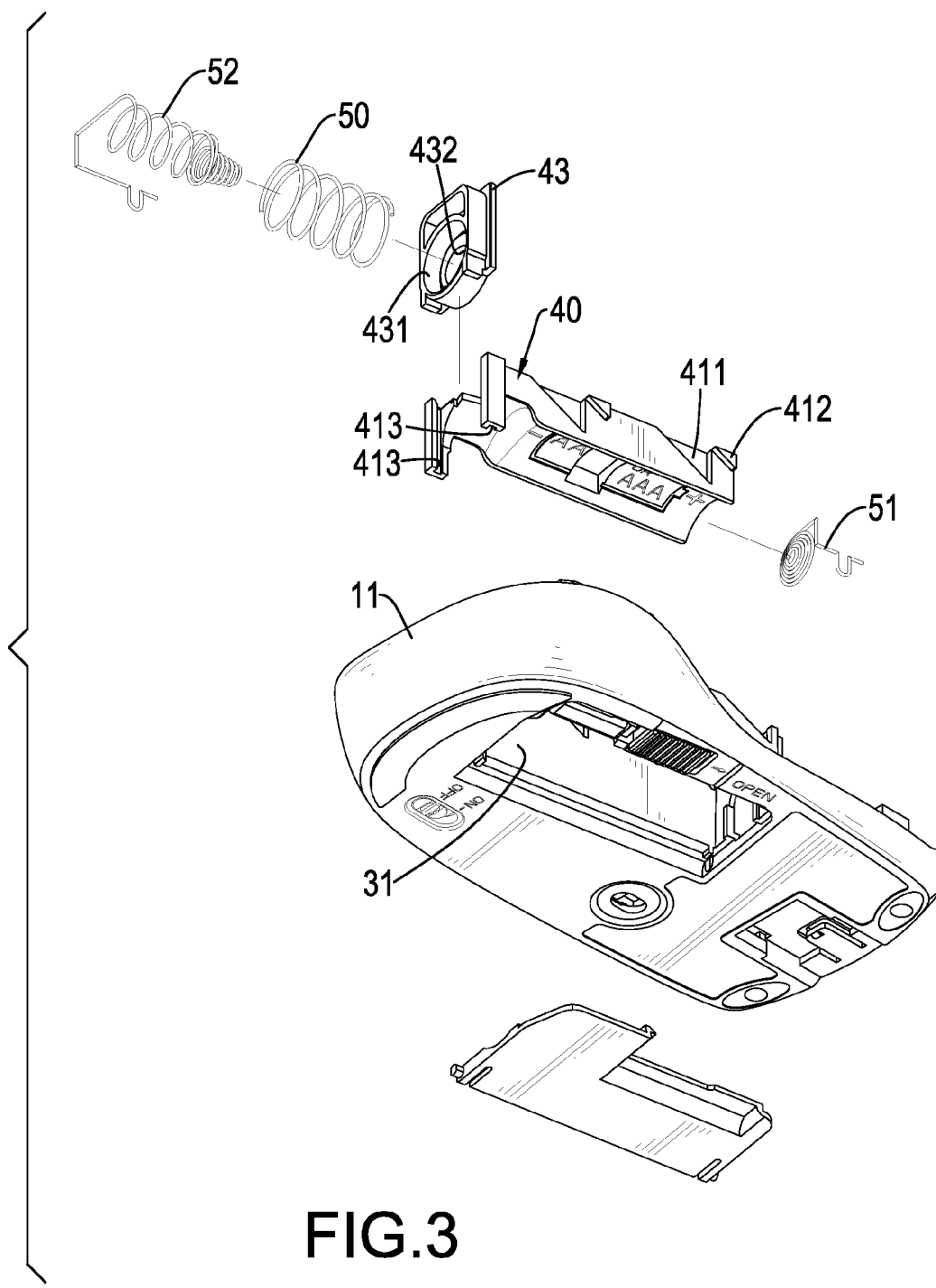
FIG. 3 is an exploded perspective view of the electronic device of FIG. 1.

With reference to FIGS. 1-3, an embodiment of a battery box 20 of the invention mounted in an electronic device 10 is disclosed. In this embodiment, the electronic device 10 can be, but is not limited to, a wireless mouse. The battery box 20 comprises a seat 30, a battery holder 40 and a spring 50. In practice, the seat 30 can be integrally formed in a shell 11 of the electronic device 10. In this embodiment, a vertical fixture plate 36 is formed on an end of the shell 11 along a length direction of the seat 30 and is separated from the seat 30 by a distance, such that a gap is formed between an end of the seat 30 and the fixture plate 36 along the length direction of the seat 30.

The seat 30 comprises a first opening 31 and a second opening 32 opposite to the first opening 31. In this embodiment, the seat 30 has two side plates 33 formed along a width direction of the seat 30. Each side plate 33 has at least one first inclined notch 331 and at least one first rib 332. The first inclined notch 331 is formed downward from a top of the side plate 33. The first rib 332 protrudes inward from the top of the side plate 33. In this embodiment, the first inclined notch 331 and the first rib 332 are each respectively shaped into a geometrical shape with an inclined edge, such as a triangle and a trapezoid. For convenience of description, the geometrical shape can be, but is not limited to, a right triangle.

The battery holder 40 is movable toward the first opening 31 along an inclined direction and is then slideably mounted in the second opening 32 of the seat 30. In this embodiment, the battery holder 40 comprises two side pieces 41 parallel to each other and a curve plate 42. The curve plate 42 is connected between the two side pieces 41 and has a concave surface facing downward. An exterior surface of each side piece 41 has a second rib 412 and a second inclined notch 411. The second rib 412 and the second inclined notch 411 each respectively match the first inclined notch 331 and the first rib 332 of the seat 30, such that the second rib 412 can be engaged with the first inclined notch 331 and the second inclined notch 411 can be engaged with the first rib 332. The second rib 412 is smaller than the first inclined notch 331, and the first rib 332 is smaller than the second inclined notch 411, such that the first rib 332 and the second rib 412 can each respectively move along an inclined surface of the second inclined notch 411 and the first inclined notch 331. In this embodiment, an inclined surface of the right triangle is parallel to the inclined direction of the battery holder 40. In addition, because the first rib 332 extends inward from the top of the side plate 33, the battery holder 40 slideably moves to the second opening 32 along the inclined direction. The battery holder 40 stops moving as long as the first rib 332 reaches the second inclined notch 411, such that the ribs 332, 412 and the notches 331, 411 have a positioning effect.

An end of the spring 50 is pressed against an end of the battery holder 40 along the length direction of the battery holder 40 to provide a pushing force along a length direction of the battery holder 40. In this embodiment, the spring 50 is mounted in the gap between the end of the battery holder 40 along the length direction of the battery holder 40 and the fixture plate 36. In addition, the end of the battery holder 40 along the length direction of the battery holder 40 has a separable plug-in piece 43. An engagement groove 413 is formed in an inner surface of each side piece 41 of the battery holder 40 and corresponds to the plug-in piece 43 in position. The plug-in piece 43 is inserted in the engagement groove 413. A ring 431 protrudes from an exterior surface of the plug-in piece 43, wherein the exterior surface of the plug-in piece 43 faces toward the fixture plate 36 and the spring 50. An end of the spring 50 is retained in the ring 431, such that the spring 50 does not depart from the plug-in piece 43 when the battery holder 40 moves.

In order to conveniently connect an anode and a cathode of a battery to a circuit board 12 mounted in the electronic device 10, a slot 34 is formed in an end of the seat 30 to correspond to the plug-in piece 43. A first aperture 35 is formed in the other end of the seat 30. A first electrode spring 51 is inserted in the first aperture 35 of the other end of the seat 30. A second aperture 432 is formed in the plug-in piece 43 of the battery holder 40 and is aligned with the slot 34. A proper position of the second aperture 432 is inside the ring 431. Hence, a second electrode spring 52 can be mounted in the spring 50 and mounted through the second aperture 432 and the slot 34 to be retained in the end of the seat 30. In addition, the spring 50 and the second electrode spring 52 can be combined to become a spring assembly, such that the spring assembly includes two spring sections with different external diameters. A first spring section is located in the gap. A second spring section is mounted through the second aperture 432 and the slot 34 of the seat 30. An end 511 of the first electrode spring 51 and an end 521 of the second electrode spring 52 can be directly welded to an anode pad and a cathode pad of the circuit board 12 of the electronic device 10 to avoid problems of wire bonding.

Figure 4:
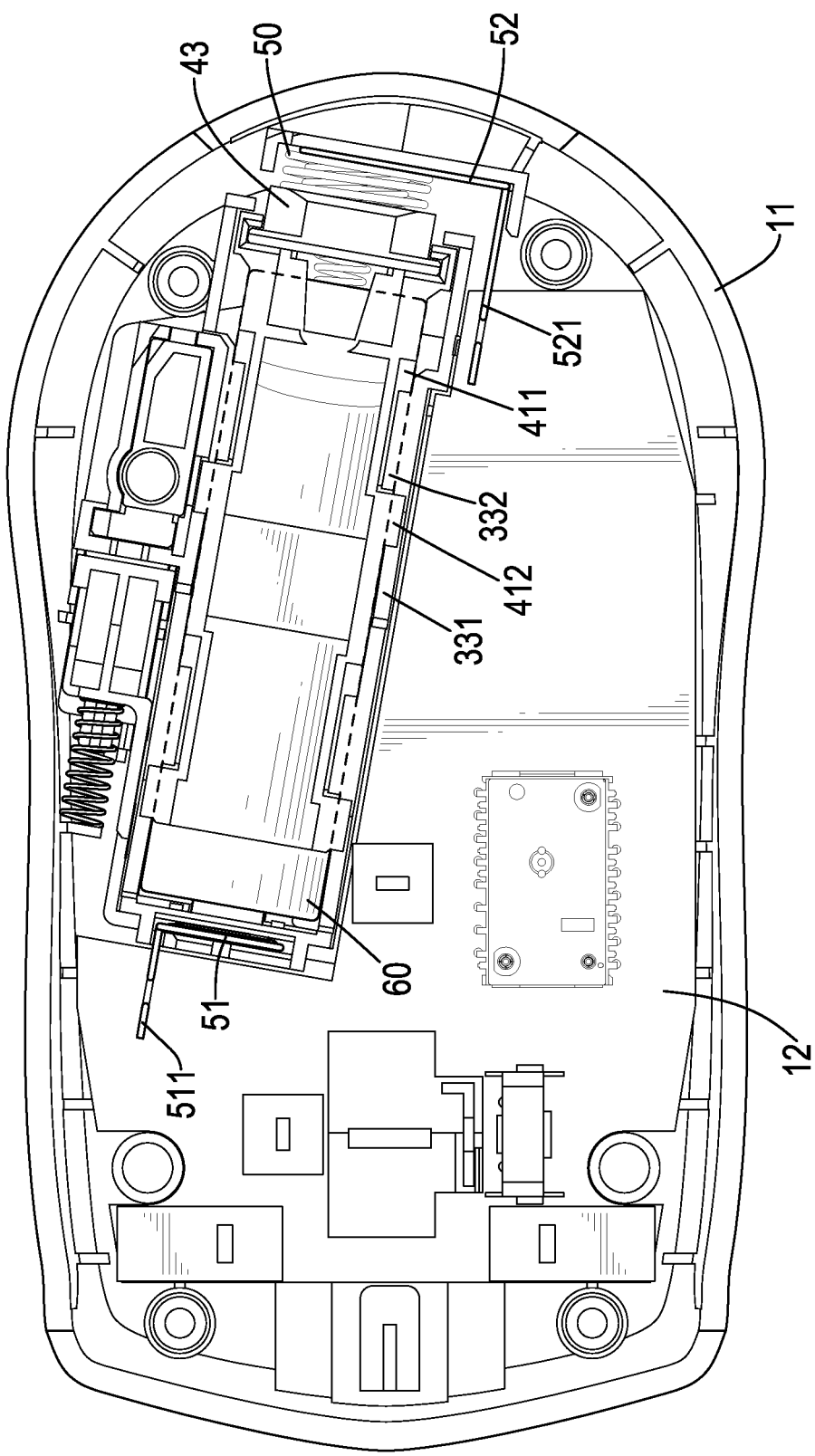
FIG. 4 is a top view of the electronic device of FIG. 1.
Figure 7A:
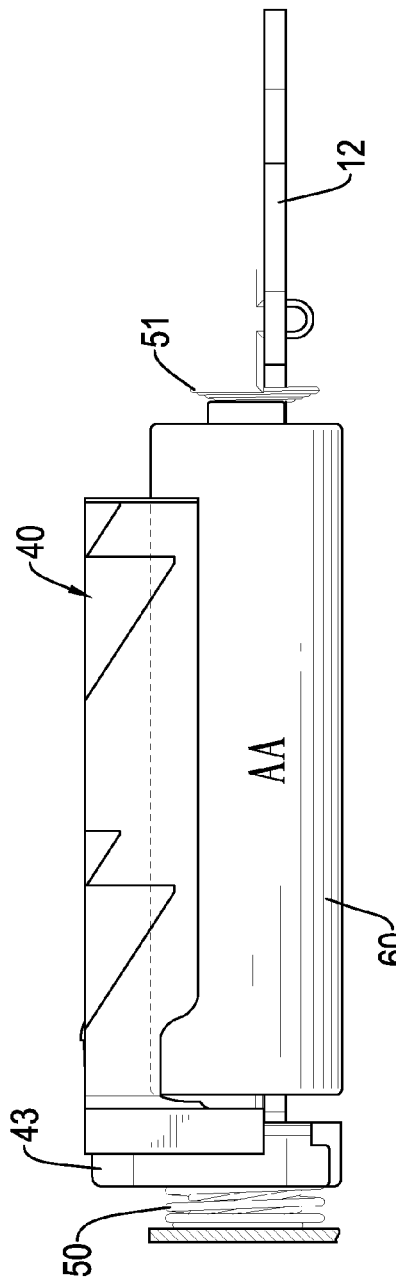
FIG. 7A is a lateral view of the battery box with a double-A battery.

The following description uses a double-A battery and a triple-A battery as an example for describing an adjusting process of the adjustable battery box 20. FIG. 1 shows a perspective view of the battery box 20 with a double-A battery 60 mounted therein. Because the double-A battery 60 is bigger than the triple-A battery, with reference to FIGS. 3 and 7A, a cathode end of the double-A 60 battery 60 is inserted backward and inclinedly into the first opening 31. With reference to FIG. 1, the plug-in piece 43 of the battery holder 40 is pushed to move toward the second opening 32. Meanwhile, the second rib 412 of the battery holder 40 is pushed to move backward and upward along the inclined surface of the first inclined notch 331. With reference to FIG. 4, the battery holder 40 compresses the spring 50 until the double-A battery 60 has enough space to be completely inserted into the seat 30 from the first opening 31. The spring 50 then pushes the plug-in piece 43 to retain the double-A battery 60 in the battery box 20.

Figure 5:
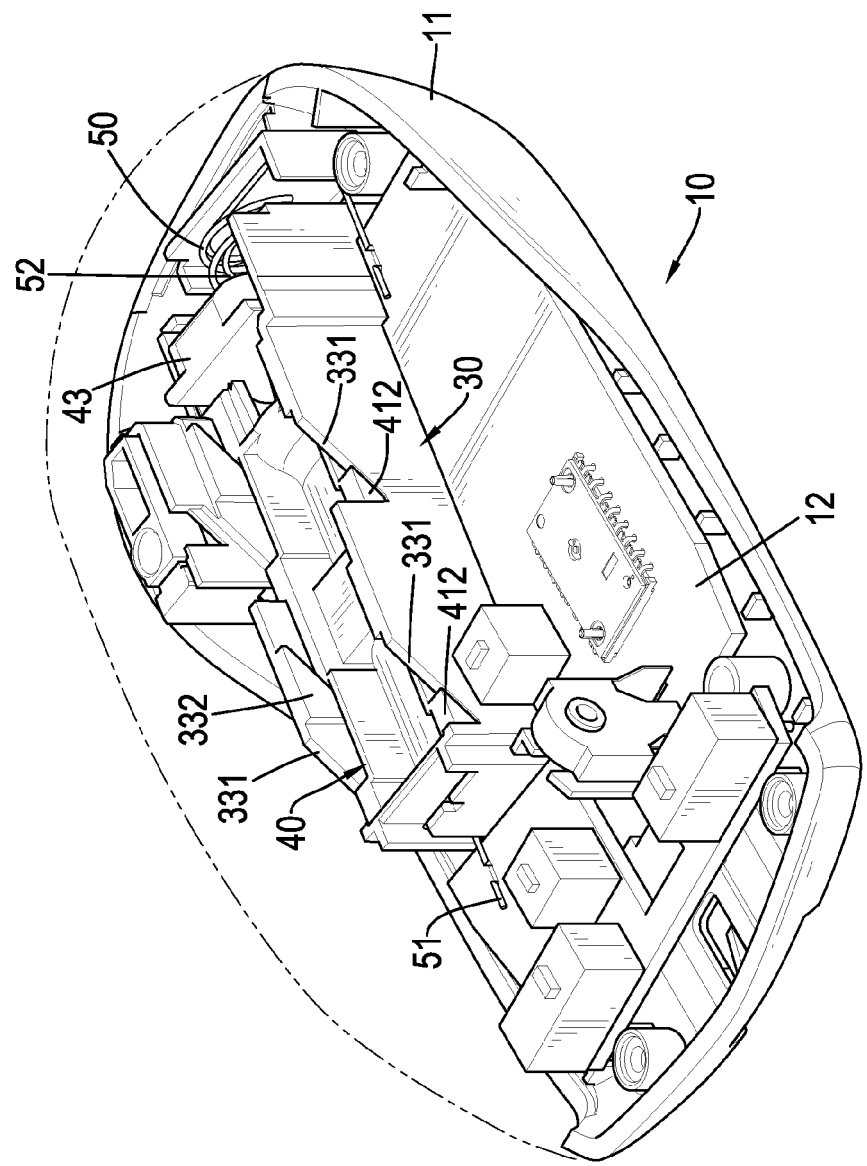
FIG. 5 is a perspective view of an electronic device of FIG. 1.
Figure 6:
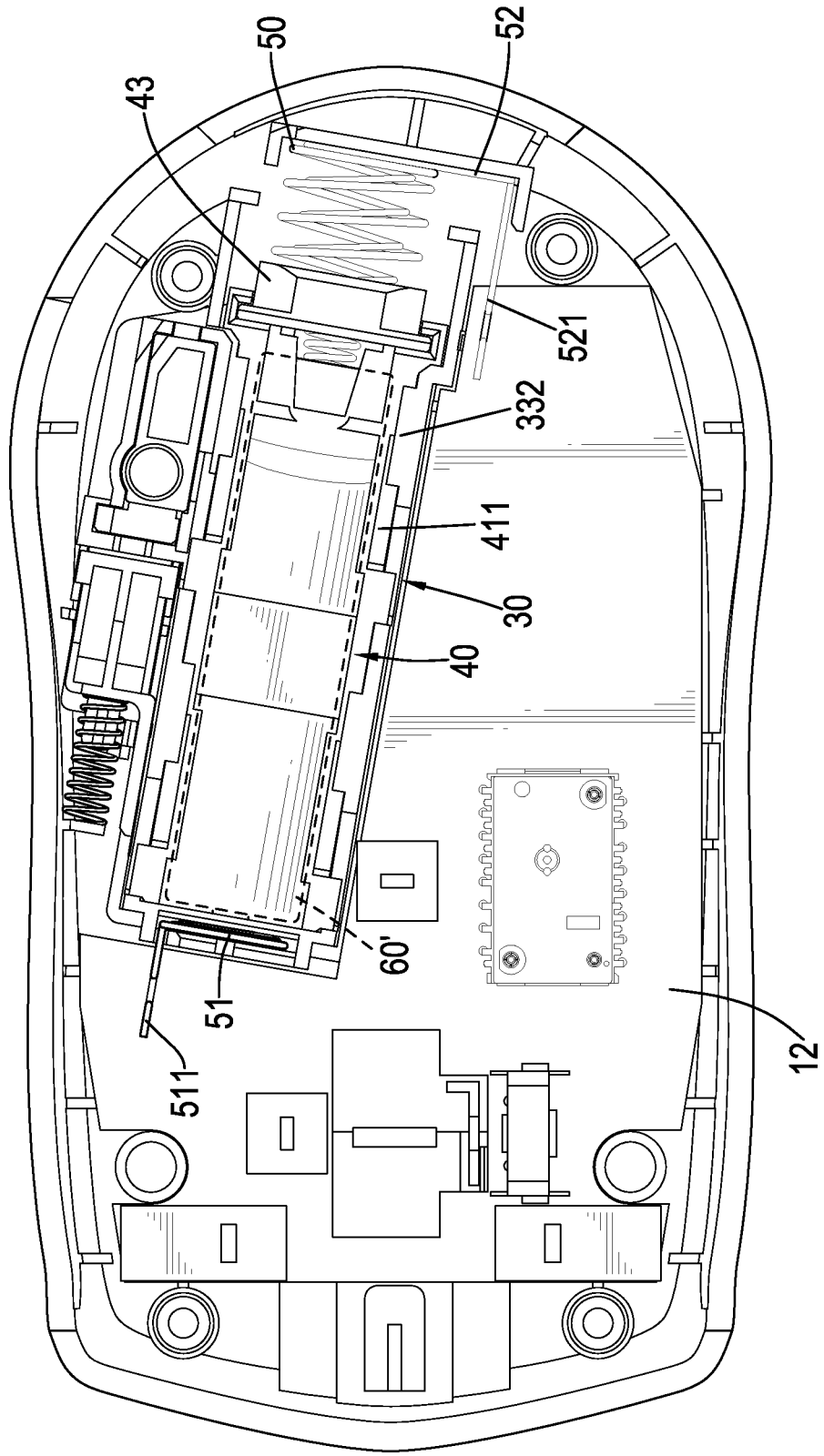
FIG. 6 is a top view of the electronic device of FIG. 5.
Figure 7B:
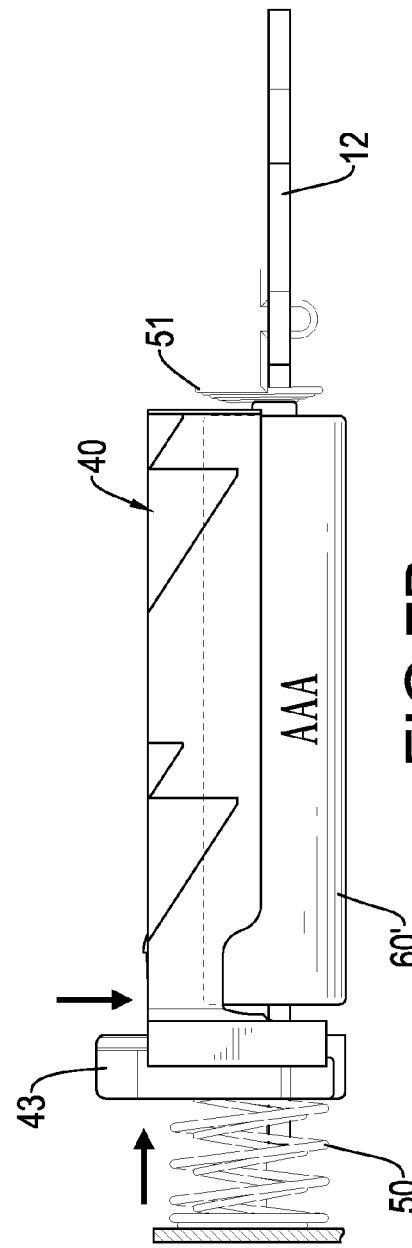
FIG. 7B is a lateral view of the battery box with a triple-A battery.

With references to FIGS. 5, 6 and 7B, when the triple-A battery 60' is inserted into the battery box 20 of the invention, similarly, a cathode end of the triple-A battery 60' is inserted into the seat 30 from the first opening 31. After the cathode end contacts the second electrode spring 52, the triple-A battery 60' pushes the plug-in piece 43 to move the battery holder 40, such that the battery holder 40 moves backward and upward and compresses the spring 50. Because the triple-A battery 60' is smaller than the double-A battery 60 and a diameter of the triple-A battery 60' is less than a diameter of the double-A battery, with reference to FIGS. 7A and 7B, a distance for the plug-in piece 43 to move backward is shorter. The second rib 412 of the battery holder 40 is located on a lower position than the first inclined notch 331. Until the triple-A battery 60' has enough space to be retained in the seat 30 from the first opening 31, the spring 50 provides a restoring force for pushing the plug-in piece 43 to move forward and downward to adjust a space of the battery box 20 for fitting the triple-A battery and securely retains the triple-A battery 60' in the battery box 20.

The double-A battery and the triple-A battery are just examples for describing an operating example of the battery box of the invention. The battery mounted in the battery box of the invention is not limited to the double-A battery and the triple-A battery.

In conclusion, the battery box of the invention is combined with a wireless mouse. The first opening of the seat is in a bottom surface of a shell of the wireless mouse. A user can change the battery through the bottom surface of the wireless mouse. Hence, with respect to the structure of the battery box for the wireless mouse, the user can replace an original battery with a battery of a different size in the battery box. The wasting problems, i.e. a user buys batteries of an incompatible size, or a user buys too many batteries of various sizes, are thus solved.

What is claimed is:
1. An adjustable battery box comprising:
a seat having a first opening and a second opening opposite to the first opening;
a battery holder movable toward the first opening along an inclined direction to be slideably mounted in the second opening of the seat; and
a spring having an end pressing against an end of the battery holder along a length direction of the battery holder; wherein
the seat has two side plates formed along a width direction of the seat, each side plate has at least one first inclined notch and at least one first rib, the first inclined notch is formed downward from a top of the side plate, and the first rib protrudes inward from the top of the side plate; and
the battery holder has two side pieces parallel to each other and a curve plate, the curve plate is connected between the two side pieces and has a concave surface facing downward, and an exterior surface of each side piece has a second rib and a second inclined notch each respectively matching the first inclined notch and the first rib, such that the second rib is engaged with the first inclined notch and the second inclined notch is engaged with the first rib.

2. The battery box as claimed in claim 1, wherein
the end of the battery holder that is pressed by the spring has a separable plug-in piece, an inner surface of each side piece has an engagement groove, the engagement groove corresponds to the plug-in piece in position, and the plug-in piece is inserted into the engagement groove; and a ring protrudes from an exterior surface of the plug-in piece, and the exterior surface of the plug-in piece faces toward the spring such that the end of the spring is retained in the ring.

3. The battery box as claimed in claim 2, wherein a slot is formed in one of two ends of the seat to correspond to the plug-in piece, a first aperture is formed in the other end of the seat opposite to the slot, and a first electrode spring is inserted in the first aperture of the seat; and the plug-in piece of the battery holder has a second aperture formed in the ring and aligned with the slot of the seat, and a second electrode spring is mounted in the spring and passes through the second aperture and the slot of the seat to be mounted through the other end of the seat.

4. The battery box as claimed in claim 3, wherein the spring includes a first spring section and a second spring section, and an external diameter of the second spring section is less than an external diameter of the first spring section;

a slot is formed in one of two ends of the seat to correspond to the plug-in piece, a first aperture is formed in the other end of the seat opposite to the slot, and a first electrode spring is inserted in the first aperture of the seat; and the plug-in piece of the battery holder has a second aperture formed in the ring and aligned with the slot of the seat, such that the second spring section passes through the second aperture and the slot of the seat to be mounted through the other end of the seat, and a boundary between the first spring section and the second spring section is pressed in the ring.

5. A battery box of an electronic device comprising:

a seat mounted in the electronic device and having two ends and a first battery retaining space for containing at least one battery;

a second electrode spring connected to one of the ends of the seat;

a first electrode spring connected to the other end of the seat;

a battery holder disposed in the seat and movable in the seat along an inclined direction to change a depth and a length of the first battery retaining space to form a second battery retaining space for containing batteries of different sizes.

6. The battery box as claimed in claim 5, wherein the seat has at least one inclined notch, and the battery holder has at least one rib formed on an exterior surface and matching the at least one inclined notch of the seat;

when the seat moves relative to the battery holder, the at least one rib of the battery holder moves along an inclined surface of the at least one inclined notch of the seat.

7. The battery box as claimed in claim 6, wherein the seat has at least one rib protruding inward, and the battery holder has at least one inclined notch matching the at least one rib of the seat.

8. The battery box as claimed in claim 5, wherein a plug-in piece is mounted between the battery holder and the second electrode spring; and when the seat moves relative to the battery holder, the battery holder moves relative to the plug-in piece.

9. The battery box as claimed in claim 8, wherein a spring is mounted between the second electrode spring and the plug-in piece.

* * * * *